(12) United States Patent
Prajapati et al.

(10) Patent No.: US 11,276,997 B2
(45) Date of Patent: Mar. 15, 2022

(54) INTEGRATION AND COMPENSATION FOR A PROTECTION RELAY

(71) Applicant: ABB Schweiz AG, Baden (CH)

(72) Inventors: Darshit Prajapati, Gujarat (IN); Dinesh V, Ahmedabad (IN); Nayan Shah, Gujarat (IN); Pravin Vadhiyar, Bangalore (IN); Vijay Shah, Gujarat (IN)

(73) Assignee: ABB Schweiz AG, Baden (CH)

(*) Notice: Subject to any disclaimer, the term of this patent is extended or adjusted under 35 U.S.C. 154(b) by 427 days.

(21) Appl. No.: 16/513,707

(22) Filed: Jul. 17, 2019

(65) Prior Publication Data
US 2020/0059080 A1    Feb. 20, 2020

(30) Foreign Application Priority Data

Jul. 17, 2018   (IN) .............................. 201841026573

(51) Int. Cl.
| | | |
|---|---|---|
| H02H 3/00 | (2006.01) |
| H02H 1/00 | (2006.01) |
| G01R 15/18 | (2006.01) |
| H02H 3/08 | (2006.01) |

(52) U.S. Cl.
CPC ......... H02H 1/0007 (2013.01); G01R 15/181 (2013.01); H02H 3/08 (2013.01)

(58) Field of Classification Search
None
See application file for complete search history.

(56) References Cited

U.S. PATENT DOCUMENTS

| | | | |
|---|---|---|---|
| 5,506,743 A * | 4/1996 | Phillips .................... | H02H 7/09 361/85 |
| 6,169,648 B1 * | 1/2001 | Denvir .................... | H02H 1/06 361/25 |
| 10,424,918 B2 * | 9/2019 | Ren .......................... | H01F 6/00 |

* cited by examiner

Primary Examiner — Stephen W Jackson
(74) Attorney, Agent, or Firm — Leydig, Voit & Mayer, Ltd.

(57) ABSTRACT

The present disclosure relates to a method of integration and compensation in a protection relay. The method may include the protection relay: receiving a measured signal from a Rogowski coil and converting the measured signal to digitized samples, where the measured signal is a differentiated current signal over time; iteratively computing integrated current data from the digitized samples using a first digitized function to obtain integrated value; iteratively computing a compensated current data from the integrated current data using a second digitized function to remove a DC component in the integrated current data; evaluating the compensated current data to identify a fault condition; generating a trip signal on identification of a fault condition to operate a switch to electrically disconnect to protect the power equipment. The steps of integration and compensation may be performed in time window that is within the time period of the measured signal.

6 Claims, 4 Drawing Sheets

INTEGRATION AND COMPENSATION FOR A PROTECTION RELAY

CROSS-REFERENCE TO RELATED APPLICATIONS

This application claims priority to Indian Patent Application No. 201841026573, filed Jul. 17, 2018, and entitled "METHOD FOR INTEGRATION AND COMPENSATION IN A PROTECTION RELAY AND A PROTECTION RELAY THEREOF," the entire disclosure of which is incorporated herein by reference.

TECHNICAL FIELD

The present disclosure relates, generally, to the field of electrical power systems and, more particularly, to methods for integration and compensation in a protection relay for protecting electrical equipment in a power network.

BACKGROUND

In electrical power systems, electrical equipment are used for distribution of power. During operation of the electrical equipment, there is a requirement for protecting equipment from fault conditions. The equipment are protected using protective components like protection relay devices/intelligent electronic devices (IEDs) that detect a fault condition and responds to the fault condition by electrically opening and closing portions of the power system i.e. the protection relay device can provide a trip signal on detection of the fault condition to operate a circuit breaker to electrically isolate the electrical equipment or a portion of the power system to protect the electrical equipment.

A Rogowski coil sensor is commonly used for measurement of line current and the measured current is provided to the IED/protection relay for processing to provide measured current, or/and for recording the current or/and for protection by detecting any fault condition and responding accordingly. The measuring circuit for the Rogowski coil may measure the current signal in the form of a voltage signal i.e., the output of Rogowski coil sensor maybe in the form of $v=M*di/dt$, where v is sensor output and M is mutual inductance. In such a scenario, the measured output (voltage signal) is a differentiated signal of the line current. Therefore, there is a need to have an integrator to obtain an accurate measure of the actual current flowing in the power line.

To reproduce the actual system current inside the protection relay/IED, integration on the output of Rogowski coil sensor can be performed using a Software or a Hardware. There is a demand of high accuracy during reproduction or reconstruction of system/line current, so that an actual measurement of the current in the power line is depicted. Generally when cutoff frequency of an integrator is kept at a range to provide an accurate measurement output the response time may have been compromised. In other situations accuracy may be somewhat compromised to achieve a better response time. It is a challenge to achieve all parameters of accuracy and fast response time at the same time.

In a scenario where Rogowski coil is used to sense the current in the power line and where a requirement of a precise and fast measurement of current signal (fast response time) is needed for functioning of protection relays, for example for functioning to provide protection during the Switch On to Fault (SOTF) and thereby to provide a SOTF feature such that the SOTF feature in protection relays/IEDs is able to detect a fault and respond to the detected fault in a power line immediately after closure of circuit breaker connected to the power line. The SOTF time varies with the amplitude of fault current with a minimum value of SOTF time, hence it is important to precisely and speedily detect the current flowing in the power line within the SOTF time i.e. the response time of the protection relay including the speed of reconstruction of the current in the power line is less than the SOTF time. Similarly, there can be other examples where a better response time along with line current measurement accuracy are required such as relay operation for auto-recloser where it is required that fault condition is identified within a stipulated time to operate the auto-recloser.

To achieve such speed (response) and measurement accuracy for reproducing line current, additional analog-hardware filtering circuit can be implemented for integration which leads to increase in complexity and overall cost and may also reduce reliability of circuit. For greater flexibility and better utilization of processing units in an IED/protection relay, a solution can be implemented as a software or a firmware or in a combination with some portion of hardware.

Hence, there is a need for an efficient method for achieving an accurate measurement of the line current with a faster response time.

SUMMARY

The above-mentioned shortcomings, disadvantages and problems are addressed herein which will be understood by reading and understanding the following specification.

The present disclosure provides a method for protection of a power equipment connected to a power line with a protection relay. The protection relay is interfaced with a Rogowski coil used for measurement of alternating current and to a switch to disconnect the power equipment from a power source in the power line. The method comprising, the protection relay: receiving a measured signal from the Rogowski coil and converting the measured signal to digitized samples with an input/output interface of the protection relay, wherein the measured signal from the Rogowski coil is a differentiated current signal over time. Then, computing a time period of the measured signal from the digitized samples; iteratively computing integrated current data from the digitized samples using a first digitized function to obtain integrated value for the differentiated current signal measured with the Rogowski coil. Iteratively computing a compensated current data from the integrated current data using a second digitized function to remove a DC component in the integrated current data. Evaluating the compensated current data to identify a fault condition by comparing a measured current value computed from the compensated current data with a threshold. Finally, generating a trip signal on identification of a fault condition to operate a switch to electrically disconnect to protect the power equipment on identification of the fault condition. The step of computing the integrated current samples and the step of computing the compensated current samples are performed in a time window that is within the time period of the measured alternating current.

In an embodiment of the present disclosure, the step of computing integrated current data from the digitized samples using the first digitized function that is computed as a weighted sum of a value of the digitized samples at an instant and the value of integrated current data at an immediate previous instant.

In an embodiment, the step of iteratively computing a compensated current data from the integrated current data with the second digitized function that uses a moving time window of the time period of the measured signal for computing a difference between: a) the integrated sample data at an instant which has occurred before the half-cycle time period in the moving time window, and b) an average DC value over the integrated current data obtained in the moving time window.

In an embodiment, the step of iteratively computing the compensated current data further comprises computing the DC component for the time period of the measured signal by determining the number of samples in the time period of the measured signal and the determination is carried out as one of; considering a fixed number of samples where a variable sampling frequency is used for sampling the measured signal, and considering a variable number of samples obtained within the time period where a fixed sampling frequency is used for sampling the measured signal.

In another aspect of the present disclosure, a protection relay is connected to a power line, the protection relay is interfaced with a Rogowski coil used for measurement of alternating current and to a switch to disconnect the power equipment from a power source in the power line, the protection relay comprising: an input interface for receiving a signal representing measured current from the Rogowski coil and having them processed as digitized current samples; an integrator unit using a first digitized function for iteratively integrating the digitized current samples to obtain an integrated current data; a compensator unit using a second digitized function for iteratively compensating the integrated current data by removing DC component in the integrated current data over an alternating current cycle time period to give a compensated current output within the alternating current cycle time period; and a protection unit for evaluating the compensated current to identify a fault condition from the compensated current signal using a threshold value pre-configured in the protection relay and provide a trip signal with an output interface to operate the switch to electrically isolate the protected electrical equipment on identification of the fault condition.

In an embodiment, the input interface of the protection relay comprises: an anti-aliasing filter to generate a filtered signal with zero phase shift between fundamental and sub-harmonics frequencies from the signal received from the Rogoswki coil; and a sampling block for sampling the filtered signal to obtain the digitized current samples.

BRIEF DESCRIPTION OF DRAWINGS

The appended drawings illustrate exemplary embodiments as disclosed herein, and are not to be considered limiting in scope. In the drawings.

DETAILED DESCRIPTION

The present disclosure is related to a method for protection of a power equipment connected to a power line with a protection relay that provides/processes improved measurement accuracy and response. The protection relay is interfaced to receive measurement from a Rogowski coil, where the Rogowski coil is used for measurement of alternating current flowing in the power line and the protection relay performs signal processing of the measured signal to properly integrate the measured value to obtain true value of current flowing in the power line. The present disclosure discloses a method for accurate and faster reconstruction of current flowing in the power line i.e., within half cycle of an alternating current and further processing of the measured current for carrying out functions of the detecting fault and provide at least one relay function, for example, provide protection (provide trip signal for circuit breaker on detection of fault) to electrical equipment or/and measured value recording (function as data recorder).

In the following detailed description, reference is made to the accompanying drawings that form a part hereof, and in which is shown by way of illustration specific embodiments, which may be practiced. These embodiments are described in sufficient detail to enable those skilled in the art to practice the embodiments, and it is to be understood that other embodiments may be utilized. The following detailed description is, therefore, not to be taken in a limiting sense.

The relationship between response time of an integrator or a first order low pass filter and cut off frequency is such that lower the cutoff frequency higher the response time and vice versa. There is a demand of high accuracy and faster response time during reproduction or reconstruction of system current. Generally for an exemplary scenario, cutoff frequency of an integrator is kept at around <5 Hz to provide proper integration of Rogowski output and hence the response time of this integrator is >200 mSec. There is always the situations where we can either compromise with accuracy (i.e. in Gain and Phase response) or performance (i.e. response time). It is a challenge to achieve all parameters (i.e. gain and phase response with fast response time) at the same time.

In an exemplary scenario, in order to achieve better integration performance at 50 Hz the filter cutoff frequency is set to 0.5 Hz but with this the step response time is 2 Sec. This step response time can be improved to 20 msec but that can be achieved by compromising with the integration performance with 50 Hz cutoff frequency. So either of integration performance or fast response time is achieved at a time. The present disclosure discloses a method that can achieve a good and accurate integration performance with a fast response time or speedy reconstruction of current in the line.

Figure 1:
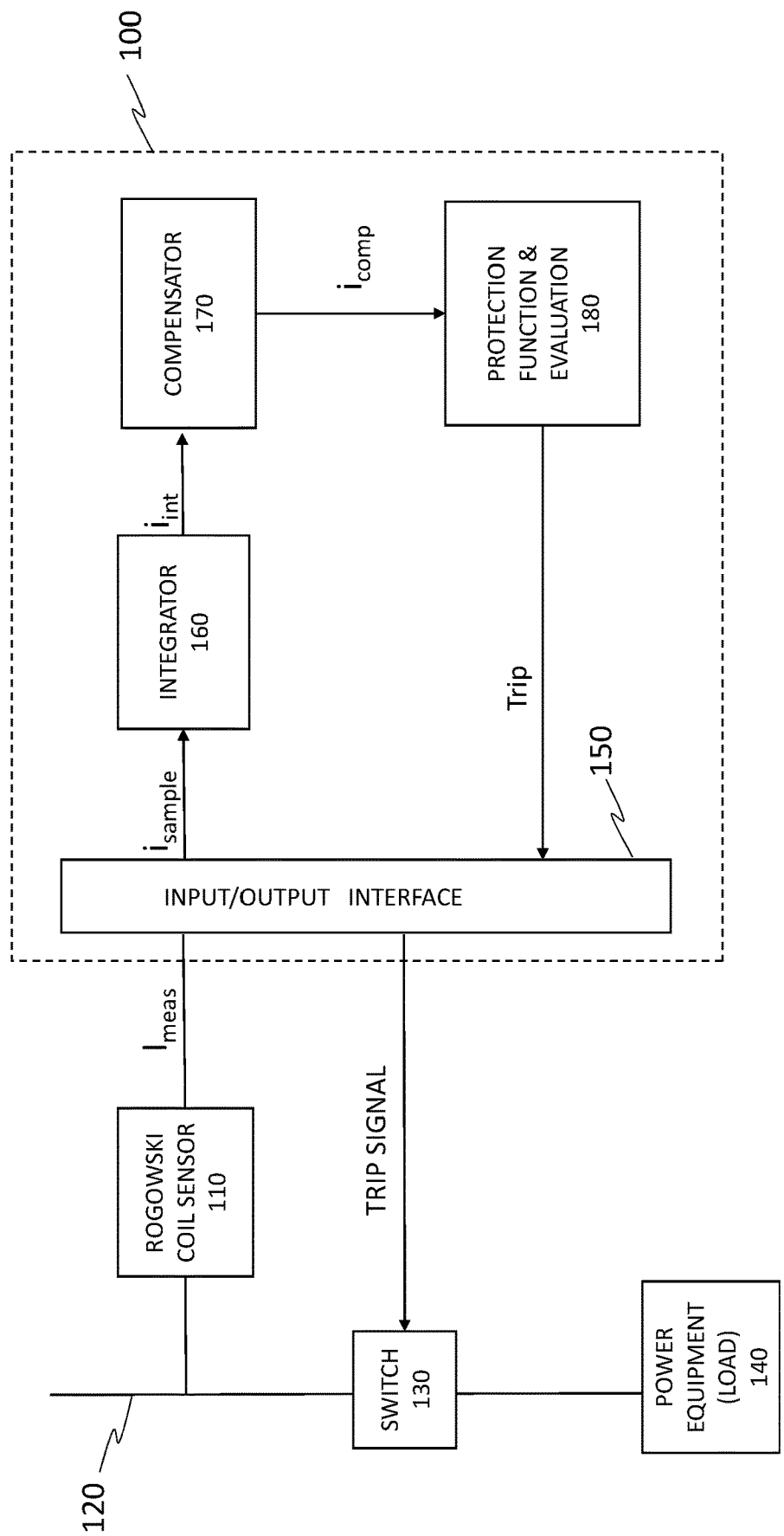
FIG. 1 is a block diagram of the method for protection of the power equipment.

FIG. 1 illustrates a block diagram representation of a protection relay/intelligent electronic device (IED) 100 connected that is interfaced with a Rogowski coil 110 used for measurement of alternating current in a power line 120. The protection relay 100 is also interfaced to a switch 130 to disconnect a power equipment/load 140 from a power source (not shown) in the power line 120 on detection of fault. The IED 100 comprises an input/output interface 150 for receiving signal (voltage signal representing measured current) $I_{meas}$ from the Rogowski coil and having them processed as digitized samples $I_{sample}$ (represented as digitalized current samples). In case, the received signal is analog signal, the signal is digitized with Analog to digital convertor. The digitized current samples are digitally processed for integration to accurately have the measure of the current flowing in the electrical line. Therefore, the IED 100 comprises an integrator block 160 for integrating the signal from the Rogowski coil which provides a voltage signal that represents a differentiated current signal over time, to provide an integrated signal $I_{int}$. Further, the IED comprises a compensator for compensating the current signal from the integrated current signal to give a compensated current output $I_{comp}$.

In this example, the IED has a protection block 180 for evaluating the compensated current $I_{comp}$ so as to identify a fault condition. The fault condition is identified by comparing the compensated current signal $I_{comp}$ or a derived parameter from the compensated current signal $I_{comp}$ (as per the known techniques of processing the measured current for detecting one or many fault conditions) with a threshold which is set/configured in the IED and based on the outcome of the comparison (i.e. positive determination of a fault condition) generation a trip signal to activate a switch (circuit breaker), 130 to electrically isolate the protected electrical equipment. The trip signal is provided through the output interface for operating the switch 130. As mentioned earlier, the processing done by the IED, it is required that the time taken for computing the integrated current signal and computing the compensated current signal need to be small to work for SOTF feature or for auto-recloser, and in the present disclosure the processing is less than the time period of the measured alternating current (i.e. the time period of the AC cycle).

As mentioned earlier, self-powered protection relay generally have a Switch On to Fault (SOTF) feature. This SOTF time varies with the amplitude of fault current. SOTF feature is provided in protection relays/IEDs to clear a detected fault in a power line immediately after closure of circuit breaker connected to the power line. The SOTF time varies with the amplitude of fault current with a minimum value of SOTF time, hence it is important to precisely and speedily detect the current flowing in the power line so that the SOTF time requirement can be met i.e. the processing time by the IED is much less for the activities for reconstruction of the current signal in the power line from the measured voltage signal that represents the current and thereby have an acceptable response time of the protection relay for the SOTF feature.

In an exemplary scenario, a protection relay is provided with auto-recloser functionality. The first reclosing operation of the circuit breaker is required to be accurate, however due to presence of residual current in the circuit or due to errors that arise from less accurate measurement of the current, there is chance of false information being communicated leading to a false detection. Further, the minimum trip time from 'Close' to 'Open' condition of the circuit breaker is greater or equal to 80 mSec which is similar to SOTF time and hence the criticality involved in having a fast response time to reconstruct the current in the power line.

It may be known to a person skilled in the art that due to sudden change in power demand of a load connected to the power line the current can drastically increase from one level to another. This rapid change should be measured immediately and accurately, and for this the IED along with the measurement sensors used needs to be capable of measuring accurately and respond quick enough to closely follow the rapid change occurring in the value of line current flowing in the electrical line. Hence, the current is to be measured accurately with good response to be capable of taking immediate corrective action for various functions like SOTF and auto-reclosing function.

Figure 2:
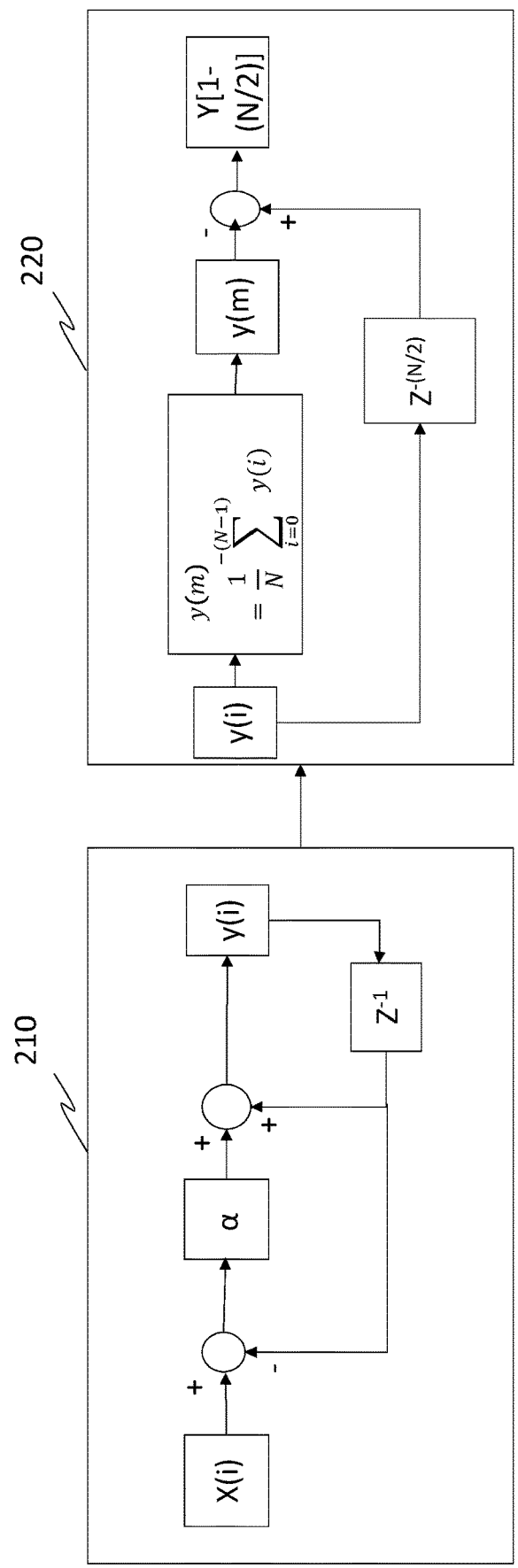
FIG. 2 is a block diagram showing the integrator block and the compensator block in detail.

FIG. 2 is a block diagram representation of the signal processing that is being done in the IED to obtain an accurate representation of the line current. In this Figure, the signal processing is depicted with a first digitized function and a second digitized function. As mentioned, the signal (voltage output received from the Rogowski coil) is received through an input/output interface of the protection relay which is a differentiated current signal over time and needs to be integrated to have a measure of the current flowing in the line connected with the Rogowski coil. The block 210 (having a first digitized function) carries out the function of integrating the signal from the digitized samples using the first digitized function (comprised in the integrator block, 160). The digitized current signal is represented as X(i) in block 210 which is the input and as a first step, the transfer function of integrator for integration is provided. A first order integrator transfer function (discrete-time) used for integration of the digitized sample, i.e., the first digitized function is provided below:

$$y(i)=\alpha*X(i)+(1-\alpha)*y(i-1),$$

y(i) represents the integrated data which is computed iteratively using the digitized sample obtained at the $i^{th}$ instant (present instant) of time (X(i)) and the value of integrated current obtained in a previous iteration (i−1) considered in corresponding proportions of gain value, a, for a time period corresponding to a full alternating current cycle. Thus, the integrated current data is computed using the digitized samples using the first digitized function which is a transfer function providing the integrated current data as a weighted sum of a value of the digitized samples at an instant ($i^{th}$) and the value of integrated current data at an immediate previous instant $(i-1)^{th}$. The weight of the digitized samples at the instant and the weight of the value of integrated current data are α and (1−α) respectively. A person skilled in the art would recognize that the coefficient, a is a constant and determines the performance of the integrator and needs to be programmed to deliver the required performance. For the purpose of convenience in determining the value of a, the a value can also be expressed in terms of time constants expressed with R and C values, as per the equivalent electronic integrator developed using resistance value R1 and R2, together with a capacitance value of C. This expression is provided below:

$$\alpha=(\Delta T/R1C)/(1+\Delta T/R2C), \Delta T=\text{Sampling Time}$$

The sampling time ΔT is a time value obtained as a reciprocal of sampling frequency. This method can be worked with a fixed sampling frequency by which the number of digitized samples may vary according to alternating current cycle frequency, and also with a variable sampling frequency where the number of digitized samples are fixed for an alternating current cycle.

Some examples are provided herein to indicate the parameters influencing the performance of the integrator. For integrator cut-off frequency 0.499 Hz, when subjected to a step change the rise-time of the integrator response is expected to be 2 sec with R1, R2 related as R1=0.01R2. For integrator cut-off frequency 4.99 Hz, when subjected to a step change the rise-time of the integrator response is expected to be 200 msec with R1, R2 related as R1=0.1R2. For integrator cut-off frequency 49.99 Hz, when subjected to a step change the rise-time of the integrator response is expected to be 20 msec with R1, R2 related as R1=R2.

A predefined cut-off value of filter i.e., RC value for high accuracy in gain and phase response is used that leads to introduction of DC component in output signal y(i). The DC offset is compensated later in block 220 using the second digitized function (processed in the compensator block, 170 in the IED).

The integrated signal with DC component y(i) is provided to block 220 for removal of DC component. The DC component present in the signal is based on the fixed samples per cycle. The signal y(i) is received from block 210. The DC component present in the signal y(i) is calculated for a variable switching frequency based on the number of samples per cycle as feedback. For a fixed switching frequency, the number of samples is dynamic and is based on the cycle to cycle frequency excursions with varying number of samples per cycle. The variation in number of samples become an input parameter for DC compensation algorithm to deliver optimal performance. The compensation is performed immediately based on DC component which has been extracted/derived from preceding half cycle feed. And the computation for compensation of the signal is iteratively performed for subsequent half cycles by adopting a moving window method to process the samples being received. The moving window bank for N samples per cycle is prepared, shown in equation below:

$$y(i)=y(i)+\text{latest sample}-\text{oldest sample}$$

During power ON calculation, the oldest sample is considered as zero.

When half cycle i.e., N/2 samples is completed, the DC component is calculated as per equation given below:

$$y(m) = \frac{1}{N} \sum_{i=0}^{-(N-1)} y(i)$$

On half cycle basis, i.e., for N/2, the calculated DC component is subtracted from signal y(i). The DC compensated output with removal of DC component is given by equation below, which is the second digitized function: average DC value over an alternating current cycle data (N) in the time period of the AC cycle. Subtracted from the integrated sample data at an instant which has occurred before the half cycle time period (N/2), $$Y[i-(N/2)]=y(i-N/2))-y(m)$$

The signal Y[i−(N/2)] is advanced by N/2 samples through software shift to make it Y[i] which is the shifted disturbance record and stored for subsequent handling. A real-time correlation between the current in the power line (input signal) and other relay enabled binary input output or trip signals is represented in the disturbance record Y[i]. On trip event, the available disturbance record is captured as snapshot and other event driven processing is handled.

The input current is reconstructed as disturbance record. The primary use of the reconstructed waveform helps in different data analytics in highly accurate way. Additionally, as a byproduct True RMS (Root Means Square) value can also be obtained after 1.5 cycle, this can lead to various opportunities for extended signal processing based on True RMS value.

In order to improve the performance, software compensation is further introduced which helps in optimizing the delay (improvement by half cycle) in output reconstruction with respect to the input. This ensures resultant output is in tight correlation with the input without any delay.

The protection relay evaluates the available disturbance record Y[i] to identify a fault condition by comparing the value of Y[i] with a threshold and generating a trip signal on identification of a fault condition. Finally for protection function, a switch is operated to electrically disconnect the power equipment on identification of the fault condition. As mentioned, the step of computing the integrated current signal and the step of computing the compensated current signal are performed in a time period of the measured alternating current signal or the input signal, that is, half cycle is used for integration purpose and the next half cycle is used for compensating the current signal.

Figure 3A:
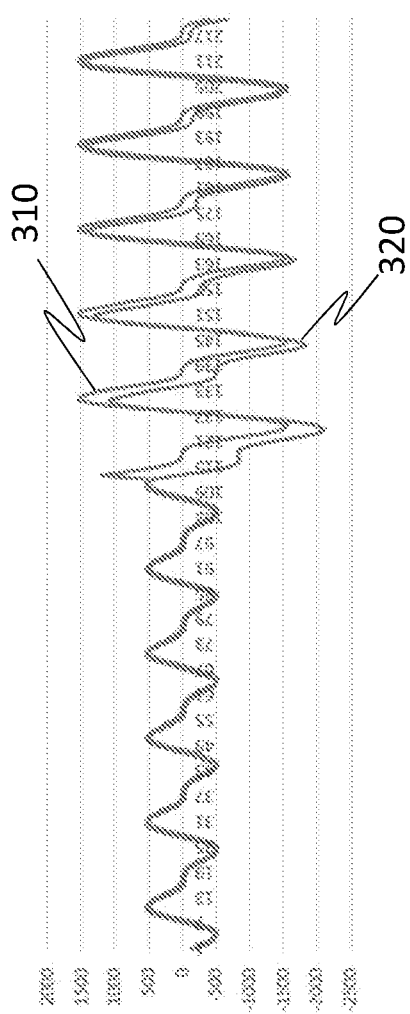
FIG. 3a is a waveform representation of the input and output response without DC compensation.
Figure 3B:
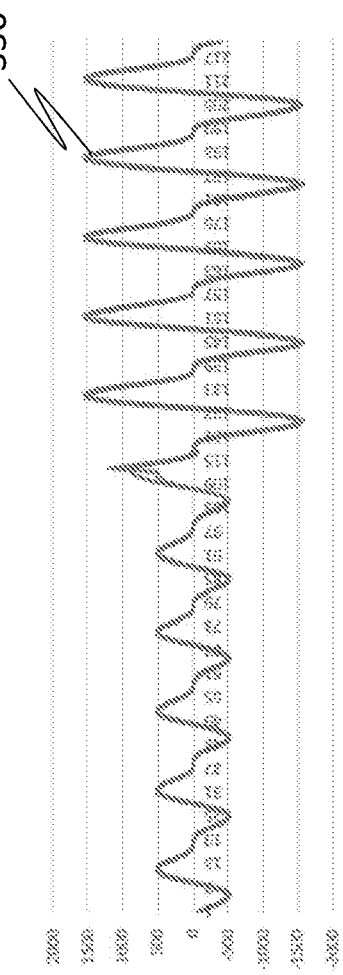
FIG. 3b is a waveform representation of the input and output response with DC compensation.

FIG. 3a is a waveform representation of the input and output response without DC compensation. It shows the input signal 310 and the output signal 320 without DC compensation. FIG. 3b is a waveform representation of the compensated current, that is by taking into account a N/2 sample shift or half cycle shift. For both FIG. 3a and FIG. 3b, the step change of input current is considered from 400 A to 1200 A to depict the response and accuracy that can be obtained by the signal processing provided in the IED.

As shown in FIG. 3b, 330 indicates the output signal reconstruction almost close to the input signal. Due to half-cycle compensation, the response time of the integrator improves from 10 power cycle (i.e. 200 mSec) to one power cycle (i.e. 20 mSec). The present disclosure provides for half cycle compensation in order to achieve both the measurement accuracy as well as time performance within a single cycle i.e. ~20 mSec for 50 Hz (half cycle for computing DC offset+half cycle response time).

The transfer function of integration is implemented using a first digitized function in the integrator block, for example a first order Infinite Impulse Response (IIR) filter or Integrator is implemented as the key processing block with specific focus on tuning various parameters to obtain accuracy in output waveform under poor power quality and transient condition. Along with the integration, as shown in FIG. 2, the DC component is calculated based on the equation $$\left\{ y(m) = \frac{1}{N} \sum_{i=0}^{-(N-1)} y(i) \right\}$$

(i.e. using the second digitized function provided in the compensator block) which has been derived from preceding half cycle feed and instantaneously compensation is performed with the first sample of next half cycle. With respect to the number of samples per cycle the compensation is performed immediately within the half cycle. And by adopting a moving window method, the computations are performed iteratively for subsequent half cycles.

Figure 4:
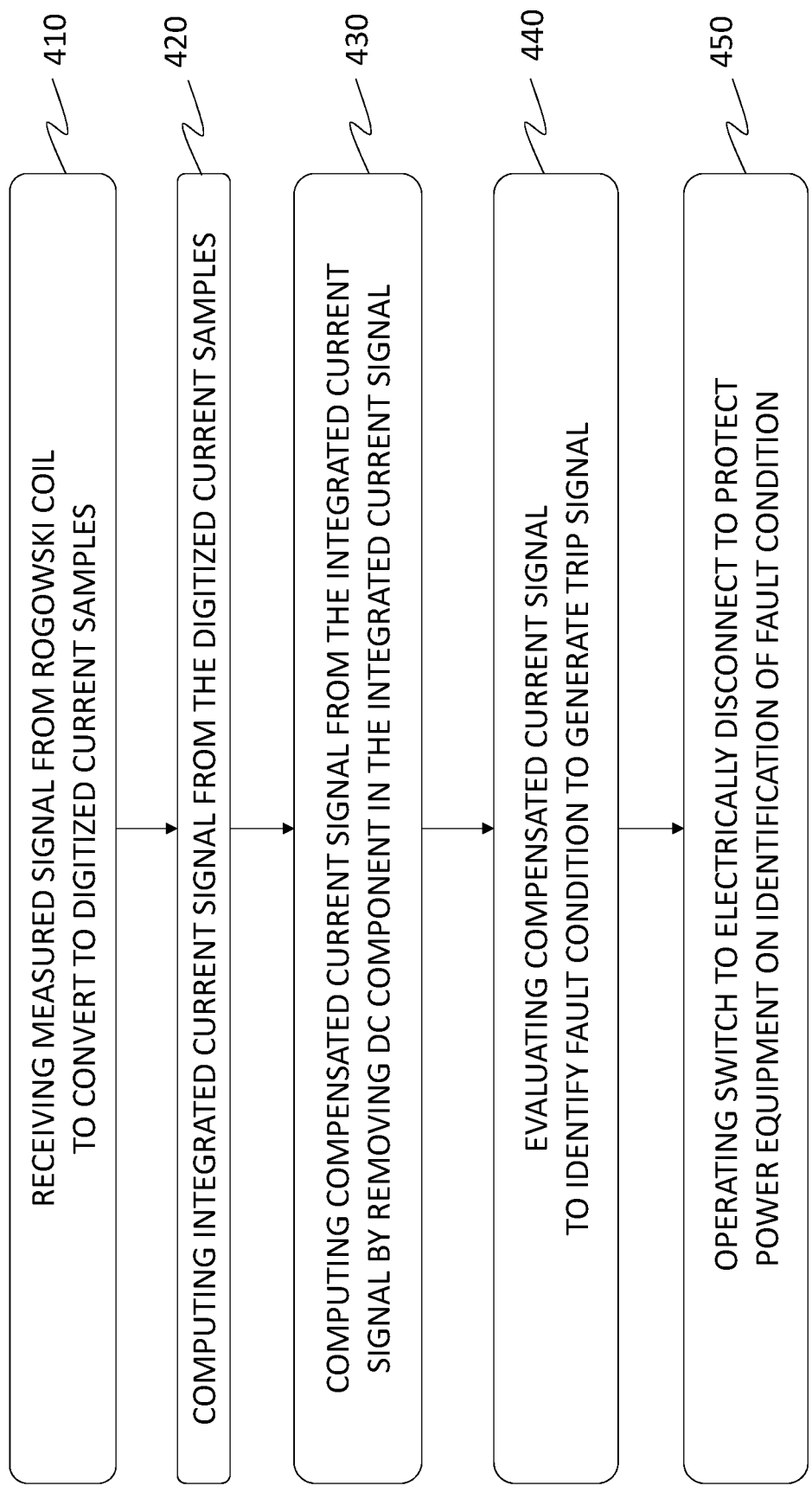
FIG. 4 is a flow diagram of the method for protection of power equipment.

FIG. 4 is a method for protection of a power equipment connected to a power line with a protection relay. As depicted in step 410, an alternating measured signal is received from the Rogowski coil through an input/output interface of the protection relay. The alternating measured signal is converted into digitized samples. The measured signal from the Rogowski coil is a differentiated current signal over time.

As depicted in step 420, an integrated current signal is computed from the digitized current samples using a first digitized function to obtain an integrated value for the differentiated current signal measured with the Rogowski coil. The first digitized function is a transfer function for integrating the digitized current samples to generate an integrated signal with a DC component. The received signal is converted to digitized current signal by applying an anti-aliasing filter with zero phase shift between fundamental and sub-harmonic frequency to generate a filtered signal. And then applying analog to digital sampling with variable switching frequency to the filtered signal to convert the filtered signal to the digitized current signal. Alternately, the filtered signal can be converted to digitized current signal by applying analog to digital sampling with fixed switching frequency.

As depicted in step 430, a compensated current signal is computed from the integrated current signal using a second digitized function to remove DC component in the integrated current signal. And the second digitized function is a compensation function for removal of DC component in the integrated signal.

As depicted in step 440, the compensated current samples is further used for processing as required to be performed by the IED (e.g. protection function or a disturbance recording function or merely displaying/communicating the value of measured current) as these samples accurately represents the value of current flowing in the electrical line being measured by the Rogowski coil. For example, for the protection function, the compensated current samples representing accurately the current flowing in the line is evaluated to identify a fault condition by comparing the current values computed using the derived compensated current samples (or other derived parameters from the compensated current samples) with a threshold and generating a trip signal on identification of a fault condition.

As depicted in step 450, a switch is operated to electrically disconnect to protect the power equipment on identification of the fault condition by the TED. The step of computing the integrated current signal 420 and the step of computing the compensated current signal 430 are performed in a (i.e. within or equal to) time period of the measured alternating current.

The method explained above are implemented in an IED to have the TED provide accurate measured values by processing for integration and compensation of the measured signal and utilize the processed value for protection function or/and for disturbance recording or/and for displaying/communicating the processed value of current.

This written description uses examples to describe the subject matter herein, including the best mode, and also to enable any person skilled in the art to make and use the subject matter. The patentable scope of the subject matter is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. A method for protection of power equipment connected to a power line with a protection relay, wherein the protection relay is interfaced with a Rogowski coil used for measurement of alternating current and to a switch to disconnect the power equipment from a power source connected to the power line, the method comprising:
   receiving a measured signal from the Rogowski coil and converting the measured signal to digitized samples with an input/output interface of the protection relay, wherein the measured signal from the Rogowski coil is a differentiated current signal over time;
   computing, with the protection relay, a time period of the measured signal from the digitized samples;
   iteratively computing, with the protection relay, integrated current data from the digitized samples using a first digitized function to obtain an integrated value for the differentiated current signal measured with the Rogowski coil;
   iteratively computing, with the protection relay, compensated current data from the integrated current data using a second digitized function to remove a direct-current (DC) component in the integrated current data;
   evaluating, with the protection relay, the compensated current data to identify a fault condition by comparing a measured current value computed from the compensated current data with a threshold; and
   generating, with the protection relay, a trip signal on identification of the fault condition to operate a switch to electrically disconnect to protect the power equipment;
   wherein the steps of computing the integrated current data and computing the compensated current data are performed in a time window that is within the time period of the measured signal.

2. The method of claim 1, wherein the step of computing the integrated current data from the digitized samples using the first digitized function comprises computing a weighted sum of (i) a value of the digitized samples at an instant and (ii) a value of the integrated current data at an immediate previous instant.

3. The method of claim 1, wherein the step of iteratively computing the compensated current data from the integrated current data with the second digitized function comprising using a moving time window of the time period of the measured signal for computing a difference between (i) the integrated current data at an instant which has occurred before the half cycle time period in the moving time window and (ii) an average DC value of the integrated current data obtained in the moving time window.

4. The method of claim 1, wherein the step of iteratively computing the compensated current data comprises computing the DC component for the time period of the measured signal by determining a number of samples in the time period of the measured signal, the determination comprising one of (i) considering a fixed number of samples where a variable sampling frequency is used for sampling the measured signal and (ii) considering a variable number of samples obtained within the time period where a fixed sampling frequency is used for sampling the measured signal.

5. A protection relay for protection of power equipment, the protection relay configured to connect to a power line coupled to a power source, a Rogowski coil to measure alternating current, and a switch to disconnect the power equipment from the power source, the protection relay comprising:
   an input interface to receive a measured signal representing measured current from the Rogowski coil and convert the measured signal to digitized current samples;
   an integrator unit to iteratively integrate the digitized current samples using a first digitized function to obtain integrated current data;
   a compensator unit to iteratively compensate the integrated current data using a second digitized function that removes a DC component in the integrated current data over a time period of the measured signal to give a compensated current output within the time period of the measured signal; and a protection unit to evaluate the compensated current output to identify a fault condition using a threshold value pre-configured in the protection relay and provide a trip signal with an output interface to operate the switch to electrically isolate the electrical equipment on identification of the fault condition.

6. The protection relay of claim 5, wherein the input interface comprises:

an anti-aliasing filter to generate a filtered signal with zero phase shift between fundamental and sub-harmonics frequencies of the measured signal received from the Rogoswki coil; and a sampling block for sampling the filtered signal to obtain the digitized current samples.

\* \* \* \* \*